United States Patent [19]

Carlson et al.

[11] Patent Number: 4,922,277
[45] Date of Patent: May 1, 1990

[54] SILICON WAFER PHOTORESIST DEVELOPER

[75] Inventors: Robert J. Carlson, Brooklyn Park; Michael D. Grimm, Minneapolis, both of Minn.

[73] Assignee: The United States of America as represented by the Secretary of the Air Force, Washington, D.C.

[21] Appl. No.: 277,082

[22] Filed: Nov. 28, 1988

[51] Int. Cl.⁵ .............................................. G03D 3/02
[52] U.S. Cl. ................................... 354/317; 354/298; 354/323; 354/324; 134/113; 134/149
[58] Field of Search ............... 354/298, 317, 323, 324, 354/325; 156/345, 626; 134/113, 149, 153, 157

[56] References Cited

U.S. PATENT DOCUMENTS

| | | | |
|---|---|---|---|
| 3,769,992 | 11/1973 | Wallestad | 134/144 |
| 3,953,265 | 4/1976 | Hood | 156/8 |
| 4,021,278 | 5/1977 | Hood et al. | 156/626 |
| 4,136,940 | 1/1979 | Lin | 354/298 |
| 4,197,000 | 4/1980 | Blackwood | 354/323 |
| 4,231,811 | 11/1980 | Somekh et al. | 148/1.5 |
| 4,429,983 | 2/1984 | Cortellino et al. | 354/320 |
| 4,466,381 | 8/1984 | Jenkins | 118/728 |
| 4,468,857 | 9/1984 | Christian et al. | 29/577 C |
| 4,544,446 | 10/1985 | Cady | 156/639 |
| 4,557,785 | 12/1985 | Ohkuma | 156/345 |
| 4,696,833 | 9/1987 | Monnig et al. | 437/225 |
| 4,706,374 | 11/1987 | Murakami | 437/225 |
| 4,755,844 | 7/1988 | Tsuchiya et al. | 134/153 |

Primary Examiner—A. A. Mathews
Attorney, Agent, or Firm—Bernard E. Franz; Donald J. Singer

[57] ABSTRACT

To provide for improved uniformity of photoresist developing of silicon wafers, developer solution is injected via an inlet port through a set of holes in a surface in a chuck and distributed across the wafer thereby developing the wafer pattern. A second set of holes in the same surface of the chuck act as exhaust outlets for the used developer. An end point detector is associated with an outlet duct. This design provides great uniformity potential since it is a single wafer system, and the holes and fluid flows can be adjusted as needed. Also, this design requires minimum developer volume which means end point detection can take place using the waste developer at the outlet. Test such as optical density or color, PH or normality, density, or others can detect photoresist content in effluent to determine completion.

4 Claims, 3 Drawing Sheets

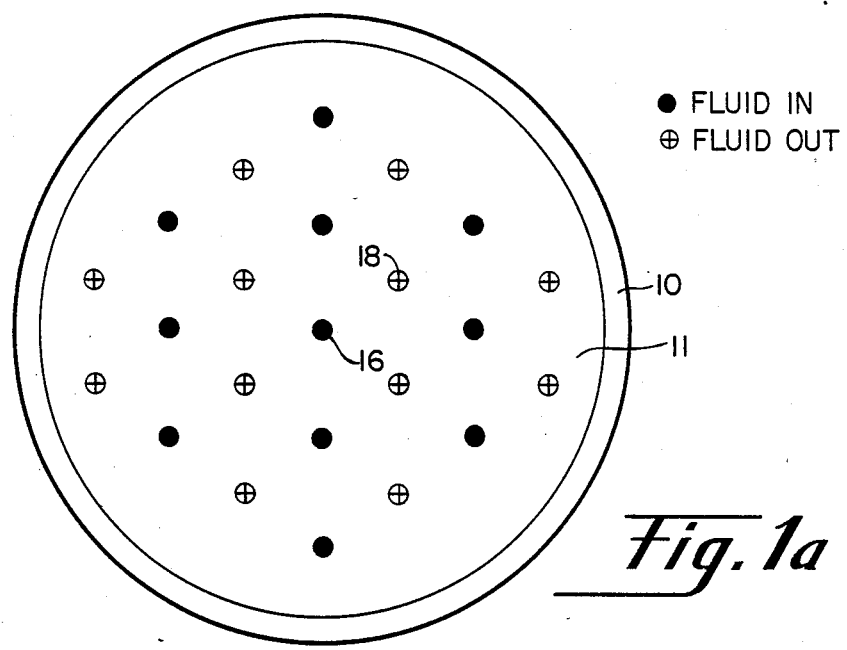
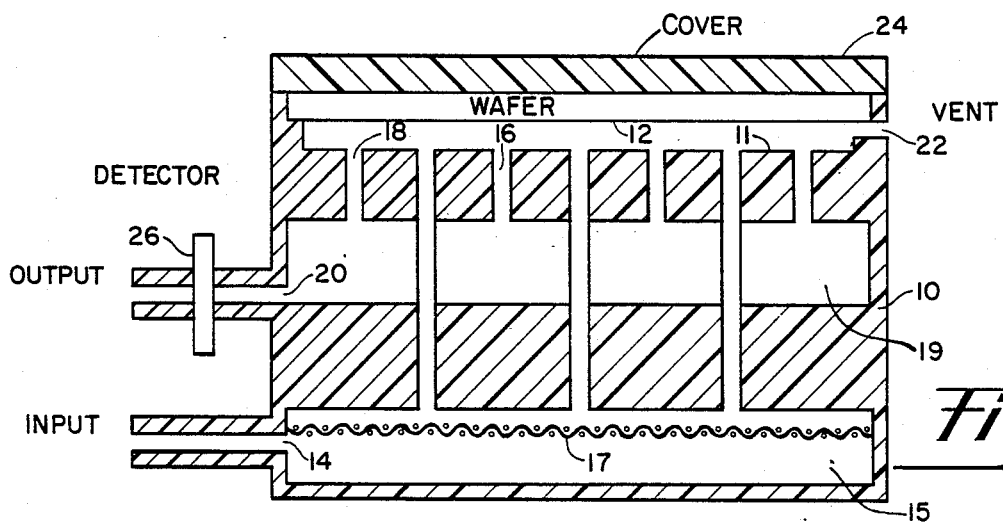
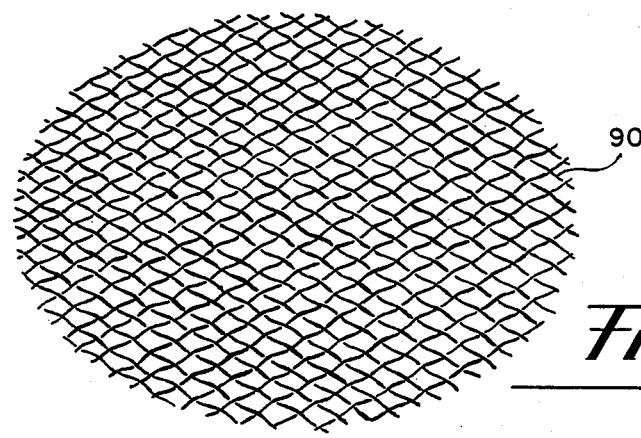

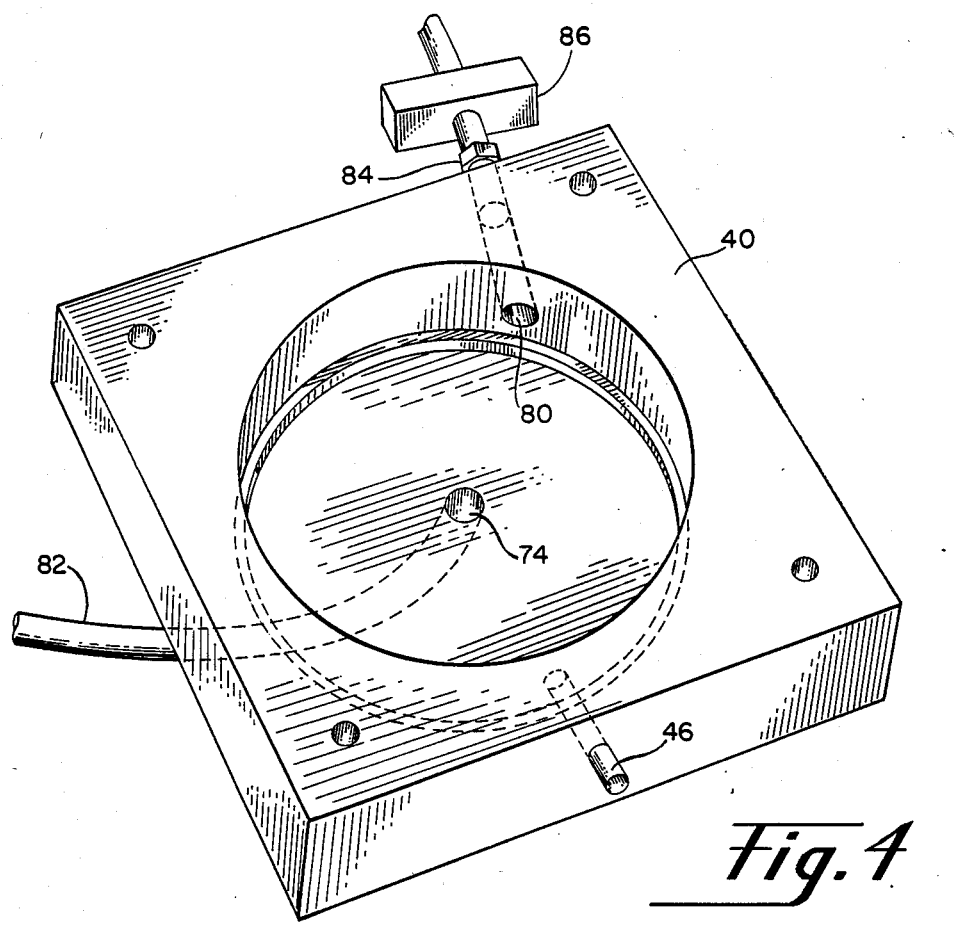
Fig. 4
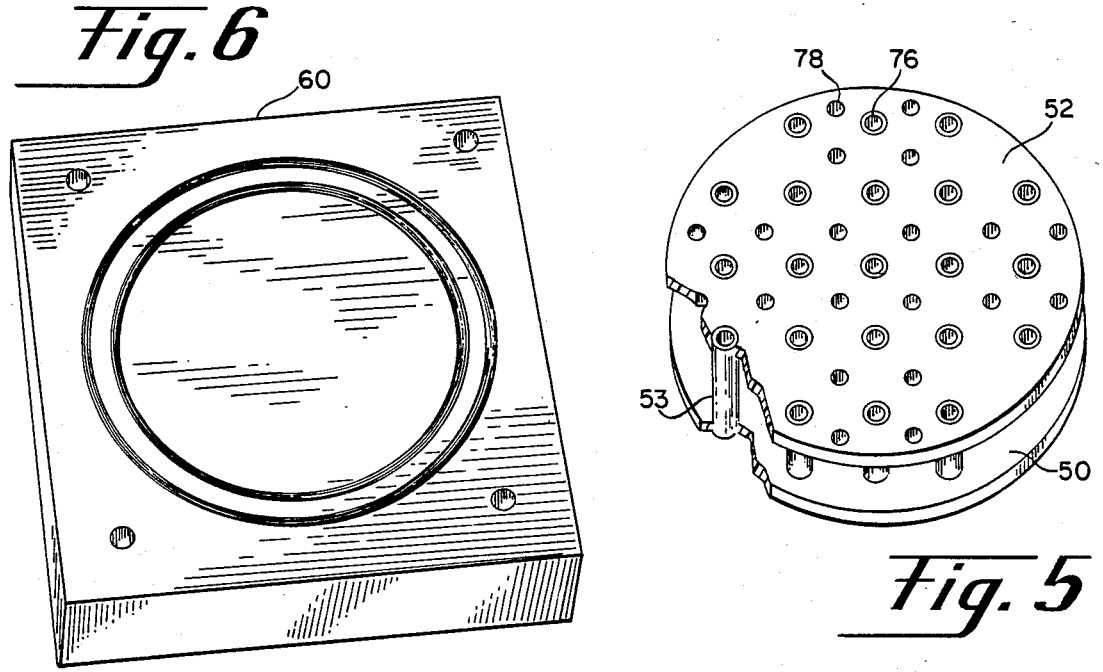
Fig. 6
Fig. 5

SILICON WAFER PHOTORESIST DEVELOPER

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a method of resist developing on a integrated circuit wafer, more particularly a silicon or GaAs wafer.

When developing lithographic patterns (formed by a photo process, E-Beam or X-ray) on integrated circuit wafers such as silicon or GaAs, uniformity of feature size can vary due to developer nonuniformity or develop time fluctuations. Typical prior methods make use of spray head developers, which have thermal and distribution nonuniformities across each wafer; and variable chemical properties are overcome by end pointing for wafer to wafer uniformity.

Apparati for liquid chemically developing silicon wafers are well known in industry. Disclosed in U.S. Pat. Nos. 3,769,992; 3,953,265; 4,021,278; 4,197,000; and 4,466,389, these systems all employ some form of spray nozzle to distribute development solution across the wafer's face. The major disadvantage with these systems is the thermal and distributional nonuniformities they produce.

U.S. Pat. No. 4,136,940 to Lin entitled "Resist Development Control System" teaches the use of a detector apparatus to determine resist development completion. The detector provides an incident light beam which illuminates a portion of the surface to be developed. Photodetectors positioned to intercept the reflected beams provide outputs corresponding to the light energy in the reflected light. As the development process begins, the light energy in the reflected beams changes. By continuously monitoring this energy level, the developing process can be terminated when this level reaches a given value.

U.S. Pat. No. 4,429,983 to Cortellino et al entitled "Developing Apparatus for Exposed Photoresist Coated Wafers" teaches the use of a development tank utilizing a rotatable, vertically translatable, shaft mounted workpiece for developing a single wafer. The wafer is secured to the workpiece, lowered into the tank of solution, and then rotated and vertically agitated for a period of time, estimating satisfactory development completion. The patent shows use of input and output ducts to transport new and used developer solution through the apparatus, but no attempt is made to continually circulate fresh developer into the tank.

U.S. Pat. No. 4,544,446 to Cady entitled "VLSI Chemical Reactor" discloses a vacuum chuck apparatus for liquid chemically developing silicon wafers. This device permits continuous processing through a series of sequential steps which practically eliminates contamination of wafers during processing. The patent teaches use of a fluid guide having a plurality of spaced holes which allow the even application of developer solution to the wafer, and a means for removing all waste developer. This patent also teaches endpoint detection as a means for controlling fluid flow into the chuck.

U.S. Pat. No. 4,231,811 to Somekh teaches a method of developing semiconductor material using a masking member having opaque and transparent areas. U.S. Pat. No. 4,468,857 to Christian teaches a method of manufacturing an integrated circuit using a wafer wherein fine alignment is achieved outside the active chip area. U.S. Pat. No. 4,696,833 to Monnig, teaches a method of providing uniform coatings to wafers by chemical vapor deposition. U.S. Pat. No. 4,706,374 to Murakami teaches a method of fabricating a semiconductor having p-type and n-type regions by immersing the substrate into an electrochemical solution.

SUMMARY OF THE INVENTION

An object of the invention is to provide for improved uniformity of resist developing.

According to the invention, a chuck is associated with an end point detector. Developer, rinse or stop bath solution is injected into an inlet port and distributed across the wafer front through holes in the chuck thereby developing the wafer pattern. A second set of holes in the chuck act as exhaust outlets for the used developer or rinse.

This design provides great uniformity potential since it is a single wafer system, and the holes and fluid flows can be customized as needed to correct for other variations (exposure, coating, baking, etc.). Secondary, this design requires minimum developer volume which means end point detection can take place using the waste developer at the outlet with fast reaction time. Tests such as optical density or color, PH or normality, density, or others can detect photoresist content in effluent to determine completion.

A feature of the invention is that there are no atmospheric, gas phase complications, plus the possibility of end point detection because of the closed system.

The invention provides a solution to the problem of spray developers, which have thermal and distribution nonuniformities across each wafer. Variable chemical properties are overcome by endpointing for wafer to wafer uniformity.

The basic benefits of the invention are: (1) it can be customized to optimize uniformity. (2) better endpoint sensitivity and (3) small liquid volume for (a) faster quench and (b) minimum chemical use.

BRIEF DESCRIPTION OF THE DRAWING

FIG. 1 is a symbolic sectional diagram showing an apparatus that liquid chemically develops exposed photoresist coated silicon wafers;

FIG. 1a is a top view of the upper face of the apparatus of FIG. 1, with the cover and wafer removed;

FIGS. 4. 5, 6 and 7 are perspective views of the chuck, flow guide cover, and a screen respectively, of the apparatus of FIG. 2.

DETAILED DESCRIPTION

Figure 2:
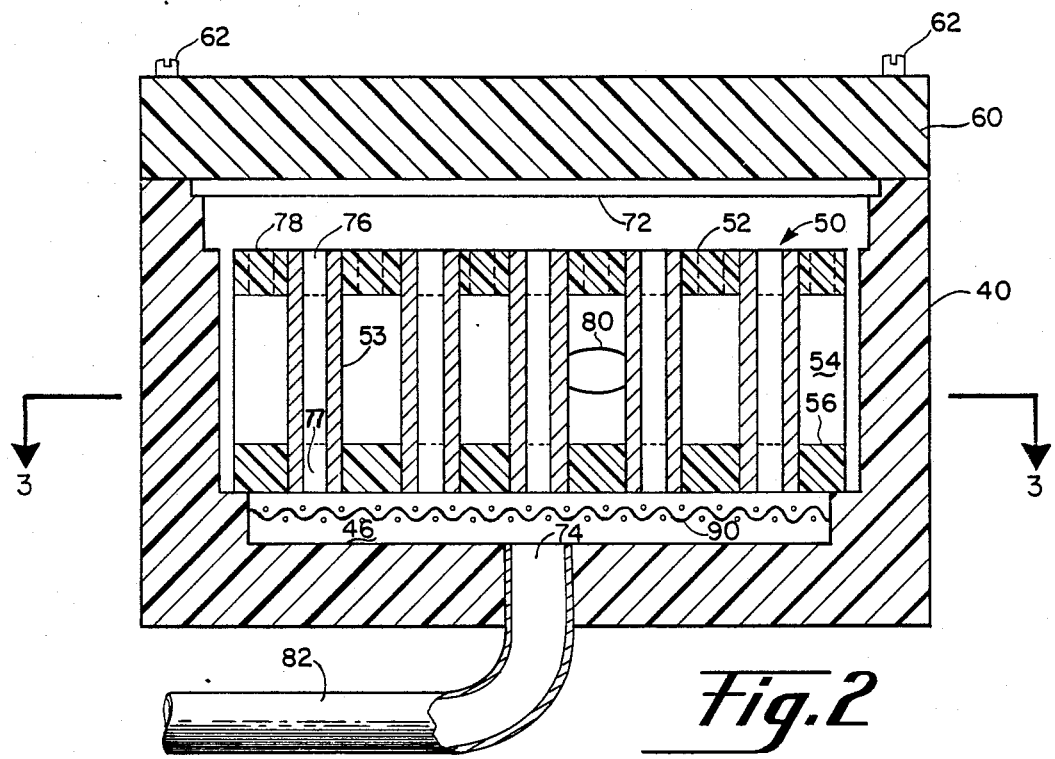
FIG. 2 is a vertical sectional view of a embodiment of apparatus for practicing the invention, taken along lines 2—2 of FIG. 3.

FIG. 1 is a symbolic sectional diagram showing an apparatus that liquid chemically develops exposed photoresist coated silicon wafers. As in most wafer development processes, precise device feature definition is directly related to the uniform application of the development medium. This apparatus allows liquid chemical development with enhanced uniformity. FIG. 1a is a top view of the upper face of the chuck of FIG. 1.

The apparatus of FIGS. 1 and 1a comprises:

a chuck 10 having a plurality of recessed holes 16 and 18 in its uppermost face 11 forming a small manifold or cavity for housing a single silicon wafer 12;

an inlet duct 14 for supplying developer solution via holes 16 to the manifold;

an outlet duct 20 for removing used developer from the manifold via the drain holes 18; and detector means 26 for performing endpoint or development completion detection.

A cover 24 closes the manifold during the development process. In FIG. 1a the cover 24 and the wafer 12 are removed to show the upper face 11 of the chuck 10. The holes 16 for fluid in are shown as solid black, and the drain holes for fluid out are shown by a cross (+) in a circle.

Developer solution is pushed into the manifold from the inlet duct 14 via a cavity 15 through the input holes 16, and distributed across the face of the wafer 12. A screen 17 may be provided in the cavity 15. A vent 22 allows air bubbles to escape. The second set of holes 18 in the manifold act as exhaust outlets for removing waste developer after it has contacted the wafer 12. The waste solution is then passed out of the apparatus through a cavity 19 and the output duct 20 and into the endpoint detector 26. At this point several tests such as optical density, color, or PH can be run to detect photoresist concentration in the effluent, which can be monitored so that accurate determination of development completion can be ascertained.

Separation of input and exhaust holes by ¼ inch provides highly uniform development due to the even distribution of developer across the wafer's face. The ability to adjust the developer fluid flow and minimize developer volume enables performance of endpoint development completion detection. Since only a small amount of solution is used by this device in the development of a single wafer commercially available detectors can accurately track the concentration of photoresist present in the expelled effluent. This practically eliminates the problem of over or under developed wafers.

U.S. Pat. No. 4,544,466 to Cady, hereby incorporated by reference, discloses a typical optical endpoint detector with feedback to a fluid flow controller.

SPECIFIC EMBODIMENT

Figure 3:
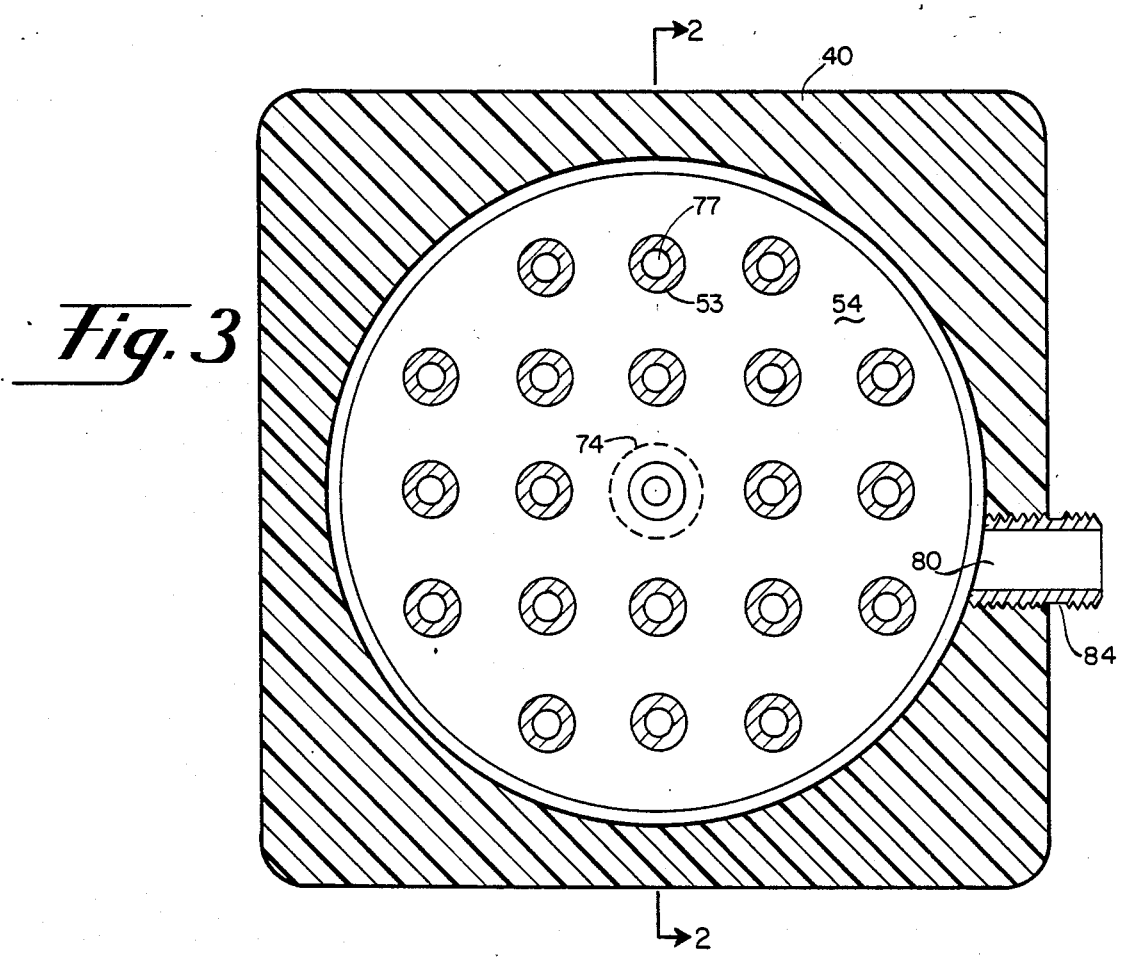
FIG. 3 is a horizontal sectional view of the apparatus of FIG. 2, taken along lines 3—3.

FIG. 2 is a vertical sectional view of an embodiment of apparatus for practicing the invention, taken along lines 2—2 of FIG. 3; and FIG. 3 is a horizontal sectional view, taken along lines 3—3 of FIG. 2. FIGS. 4, 5, 6 and 7 are perspective views or the chuck, flow guide, cover and a screen, respectively, of the apparatus of FIG. 2.

A polypropylene block 40 (FIG. 4) makes up the body of the system. There is a cavity in the center of the block for placing a develop solution flow guide 50. As shown in FIG. 4, there is an air vent 46 near the top of the block.

The develop solution flow guide 50 (FIG. 5), which directs solution to the surface of the wafer 72 and allows used solution to exit, comprises a top plate 52 and a bottom plate 56 connected by tubes, leaving a cavity 54 between the plates. Input holes 76 and drain holes 78 were drilled for solution input and output.

A stainless steel screen 90 (FIG. 7) located in the cavity beneath the flow guide acts as a baffle to redistribute develop solution flow.

A polyvinychloride cover 60 (FIG. 6) holds the wafer 72 in place and keeps the develop solution from getting on the back side of the wafer. In the prototype, the cover was held in place by screws 62 at the four corners, which extend through holes in the cover, and into tapped holes in the block. A practical device would have a hinge and latch arrangement.

An air vent 46 was installed in the polypropylene block 40 and the block was maintained at a 15° angle to allow air bubbles (but not solution) to escape. This permits the develop solution to reach the entire wafer surface, so that all areas get developed. In response to an indication of completion of development by the end point detector 86, a valve to the tubing 82 is operated to switch to a rinse or stopping solution. The system's overall small liquid volume allows for a short time to change from developer to rinse, making for quicker reactions to an endpoint signal. Experiments were conducted with various canister pressure settings (0–10 psi) and develop solution flow rates (up to 50 cc/min.) Typical develop solutions include MF319 Shipley's AZ351, xylene, methylethylketone and methylisobutylketone.

As shown in FIGS. 2, 3 and 5, the flow guide 50 has three sections, an upper plate 52 having both inlet holes 76 and drain holes 78 drilled therein, a center cavity 54 providing a flow-thru region from the drain holes 78 to an exhaust port 80, and a lower plate 56 having only the inlet holes drilled therein. To form the cavity 51, pieces of ¼-inch stainless steel tubing are force fitted into the holes 76 in the upper plate 52 and corresponding holes 77 in the lower plate 56, and held in place by friction. In FIG. 2, the drain holes 78 are shown by dashed lines extending through the upper plate 52, because of where the section is shown in FIG. 3. In FIG. 3 the drain holes do not appear, because the view is taken looking down.

The flow guide 50 could be formed in one piece, with the holes 76 drilled all the way through. Horizontal holes would be drilled from the right in FIG. 3 at the level of the exhaust port 80 between the rows of holes 76. The holes 78 would be drilled down to a depth to reach into these horizontal holes, and a portion removed at the right to connect these horizontal holes together and to the port 80.

The view of the block in FIG. 4 is a perspective view from photos. The vent 46 is a small tube inserted through a hole in the block 40 and projecting outward from the block, across from the exhaust port 80. The small size of the hole and the tilt of the block prevent liquid developer from coming out this vent.

The exhaust port 80 is formed by drilling and tapping a hole in the block 40, and placing a threaded fitting therein, to which tubing is attached. An endpoint detector 86 is provided with the tubing. In FIG. 2, the exhaust port 80 is shown in the rear to correspond to the section lines shown in FIG. 3.

The inlet port is shown as a hole 74 in the bottom of the block 40 in FIG. 2. This hole 74 appears dashed in FIG. 3, because it is hidden by the bottom plate 56 of the flow guide 50. Tubing 82 is inserted into the inlet port 74. An external holder for the block 40 provides a 15° tilt The tubing 82 may go to a solenoid valve to switch fluids (e.g. developer to rinse) with control derived from the end point detector 86.

In FIG. 6 the cover 60 is shown in perspective, with the lower surface visible. The two circles represent O-rings which provide seals for the wafer and block. Screw holes are shown at the four corners, but a hinge and latch arrangement would be better for a practical device.

It is understood that certain modifications to the invention as described may be made, as might occur to one with skill in the field of the invention, within the scope of the appended claims. Therefore all embodiments contemplated hereunder which achieve the objects of the present invention have not been shown in complete detail. Other embodiments may be developed without departing from the scope of the appended claims.

What is claimed is:

1. Apparatus for developing resist on an integrated circuit wafer comprising:
    a chuck having a surface with a plurality of inlet holes and a plurality of outlet holes, an outer wall with means adapted to receive said wafer so that it is spaced adjacent to said surface to form a chamber, inlet means for supplying developer through said inlet holes into the chamber, outlet means for removing used developer from the chamber via said outlet holes; and
    detector means located at said outlet means for performing endpoint detection to determine completion of development of the resist.

2. Apparatus according to claim 1, wherein said inlet holes and said outlet holes are distributed over said surface so as to provide for uniform development of the resist.

3. Apparatus according to claim 2, further including a vent in said outer wall for permitting the escape of gas bubbles.

4. Apparatus according to claim 3, wherein said chuck comprises a body having a bottom and a cylindrical side wall forming a cavity, with a ledge near the bottom and a lip near the top in the side wall;
    a flow guide having upper and lower surfaces, with its lower surface resting on the ledge to leave a lower cavity between it and the bottom of said body, and its upper surface being said surface with a plurality of inlet holes and a plurality of outlet holes, with the inlet holes extending through the flow guide to said lower cavity, wherein said lip forms said means adapted to receive said wafer;
    wherein said inlet means includes an inlet duct extending through said body into said lower cavity, and said outlet means includes an outlet duct extending through said cylindrical side wall and means in the flow guide connecting the outlet duct to the outlet holes;
    a vent in said outer wall for permitting the escape of gas bubbles, the vent being across from the inlet duct;
    and a cover for fastening to said body to hold the wafer in place and to prevent the developer from getting on a back side of the wafer.

* * * * *